April 5, 1966 C. P. SANDBANK 3,244,939

ENCAPSULATED DIE BONDED HYBRID INTEGRATED CIRCUIT

Filed April 15, 1963 2 Sheets-Sheet 1

Inventor
CARL P. SANDBANK
By Percy P. Lantzy
Attorney

Inventor
CARL P. SANDBANK

3,244,939
ENCAPSULATED DIE BONDED HYBRID INTEGRATED CIRCUIT

Carl Peter Sandbank, London, England, assignor to International Standard Electric Corporation, New York, N.Y., a corporation of Delaware Filed Apr. 15, 1963, Ser. No. 273,062
Claims priority, application Great Britain, Apr. 16, 1962, 14,602/62
16 Claims. (Cl. 317—101)

This invention relates to methods of mounting and encapsulating semiconductor dies containing one or more active circuit elements, to semiconductor devices and solid-state circuits mounted and encapsulated by these methods, and to circuit constructions incorporating such devices and circuits.

When it is required to incorporate semiconductor active circuit elements into miniature circuit constructions, such as printed circuits or thin film circuits on insulating substrates, then if the active circuit elements are mounted and encapsulated in conventional tubular cans with glass-to-metal seals and lead wires they may be, or may prove to be, relatively bulky in relation to the thickness of the rest of the circuit construction. The problems also arise of how the can is to be mounted into the miniature circuit construction and how the lead wires are to be satisfactorily electrically connected into the minature circuit.

It is an object of the present invention to provide a method of mounting and encapsulating a semiconductor die containing one or more active circuit elements without the use of a can, so that the thickness of the mounted and encapsulated device or circuit, as the case may be, is not appreciably thicker than the semiconductor die. A further object of the present invention is to provide such a mounted and encapsulated semiconductor die with large area sturdy terminals for incorporating the die into a miniature circuit construction.

According to one aspect of the present invention there is provided a method of mounting and encapsulating a semiconductor die, in which die there are formed one or more active circuit elements, with one electrode of at least one active circuit element at a plane surface which forms one face of the semiconductor die while the or each other electrode is at another face (or other faces) of the surface of the die, which method includes mounting the die on a thin insulating plate by joining said plane surface of the die to part of an area of thin metallic film deposited on the thin insulating plate, then connecting the or each other electrode by a thin wire to part of a separate area of thin metallic film deposited on the thin insulating plate, there being a separate area of said film for the or each other electrode, and then sealing the semiconductor die and the thin wires by depositing a mass of hardenable plastics material on the thin insulating place.

According to another aspect of the present invention there is provided a multiple semiconductor device or circuit comprising a thin insulating plate on which plate are deposited a number of areas of thin metallic film, and on which plate two or more semiconductor dies are mounted and encapsulated, each semiconductor die containing one active circuit element with one electrode at a plane surface which forms one face of the semiconductor die while the or each other electrode is at another face (or other faces) of the surface of the die, each said semiconductor die having said plane surface joined to a separate area of said thin metallic film with the or each other electrode being connected by a thin wire either to an electrode on another semiconductor die or to a separate area of said thin metallic film, and the semiconductor dies and the thin wires being sealed by a deposited mass of hardenable plastics material on the thin insulating plate.

According to yet another aspect of the present invention there is provided a transistor comprising a semiconductor die containing the three electrode regions, with the collector electrode being at a plane surface which forms one face of the die, said die being mounted on a thin insulating plate having three separate deposited areas of thin metallic film, with said plane surface collector electrode joined to part of one of said areas and a thin wire connecting the emitter and base electrodes each to part of one of the other two areas respectively, and with the die and the two thin wires sealed by a deposited mass of hardenable plastics material on the insulating plate.

A method of mounting and encapsulating a transistor die according to the present invention, and modifications to this method, will now be described with reference to the accompanying drawings in which.

Figure 1:
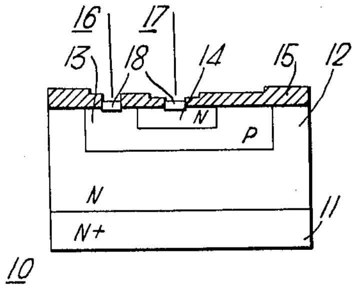
FIG. 1 shows a diagrammatic section view of a known transistor die.

In FIG. 1 there is shown an n-p-n single-crystal silicon transistor die 10 which has been formed by the known epitaxial planar technique. That is to say on to a substrate 11 of heavily-doped low resistivity $n^+$-type silicon, there has been grown, by the epitaxial technique, an n-type layer 12 of suitable resistivity to form the collector region of the transistor. The p-type base region 13 and the n-type emitter region 14 have been formed by a process of double-diffusion into the n-type region 12 through holes, etched by photolithographic techniques, in a protective silicon dioxide layer 15. The base electrode and the emitter electrode have been exposed, at 16 and 17 respectively, through the silicon dioxide layer 15, and a film of aluminum 18 alloyed into the silicon on these exposed areas.

Figure 2:
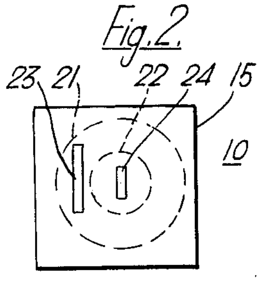
FIG. 2 shows a plan view of the transistor die of FIG. 1.

In FIG. 2, the area of the base and emitter regions, 13 and 14, in the transistor die 10 are shown by the dotted lines 21 and 22 respectively as hidden detail beneath the silicon dioxide layer 15. The shape of the base electrode area 23 and the emitter electrode area 24 are also shown.

Figure 3:
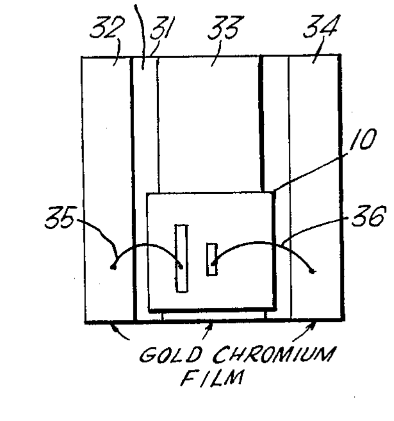
FIG. 3 shows a plan view of the transistor die mounted, in accordance with the invention, on a thin glass plate provided with stripe electrodes.

In FIG. 3 the transistor die 10 is shown mounted on one end of a thin glass plate substrate 31 on which there have been vapour deposited three thin metallic film areas in the form of gold-chromium stripes 32, 33 and 34. The gold-chromium metallic film is graded from pure chromium next to the glass to pure gold. This is achieved by changing the relative amounts of chromium and gold in the composition of the vapour during vapour deposition. The graded film has good adhesion to the glass and the top layer is suitably conducting and soft solderable. The glass plate is 0.12 inch square by 0.01 inch thick and the three stripes define three separate contact areas. The plane under-surface of the region 11 (see FIG. 1) of the transistor die 10 is joined to the centre gold-chromium stripe 33, and the base and emitter electrode areas 23 and 24 (see FIG. 2) are connected to the stripes 32 and 34 by means of thin gold wires 35 and 36 respectively. The mounting of the die and the making of the connections may be made by standard processes, such as friction alloying or thermocompression bonding; in the latter case, the application of moderate pressure at a temperature of 300° C. is sufficient to ensure a sound joint. Alternatively, silver loaded epoxy resin may be used as a jointing material.

When the joints have been satisfactorily made, the transistor die 10, the two thin gold wires 35 and 36, and the surrounding areas of gold-chromium film are sealed by depositing a mass of resin or glaze on the thin glass plate 31. The extent of this covering of hardenable plastics material is shown by 41 on FIG. 4 and FIG. 5. Sufficient of the three gold chromium areas on the glass are left exposed so that soldered contacts can be made to them, and thus to the transistor. The three exposed areas of gold chromium film on the glass plate 31 thus act as large area sturdy terminals for the transistor. The encapsulating material may be provided over both sides and edges of the glass plate 31 to afford additional protection, extending on the back of the substrate to the dashed line 42.

Figure 4:
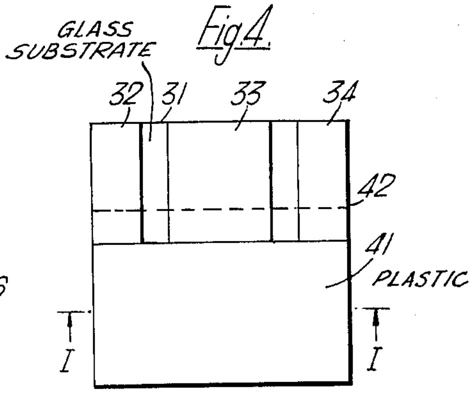
FIG. 4 shows a plan view of the mounted transistor die of FIG. 3 encapsulated in a hardenable plastics material.
Figures 5, 6:
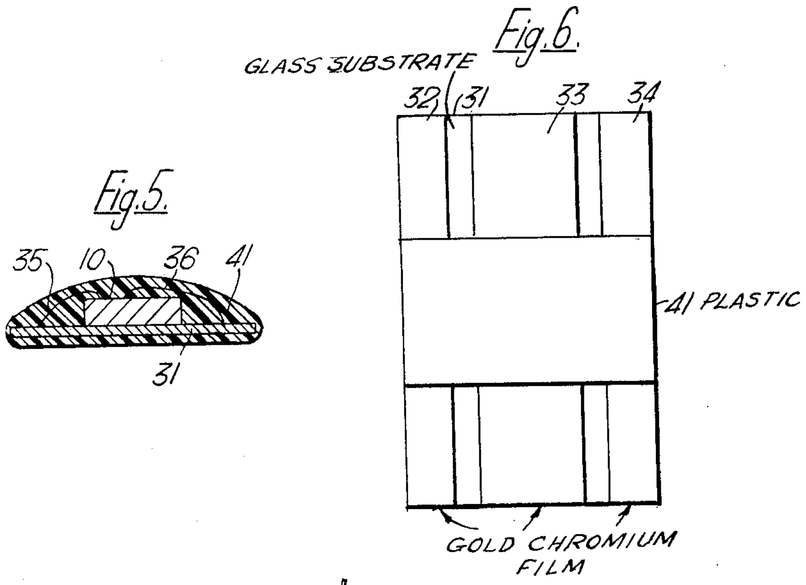
FIG. 5 shows a cross-section view of the mounted and encapsulated transistor die shown in FIG. 4, taken along the line I—I.
FIG. 6 shows a plan view of the transistor die mounted and encapsulated as shown in FIG. 4, but on a modified thin glass plate.

In FIG. 6 there is shown a glass plate 31 of greater length than that shown in FIGS. 3 and 4. The transistor die is mounted and encapsulated on a central portion of the glass plate instead of at one end. Thus exposed areas of gold-chromium film are left at both ends of the glass plate. This means that each electrode of the transistor has effectively two terminals.

The finished transistor devices shown in FIG. 4 and FIG. 6 are particularly applicable as low cost devices for automatic assembly. They may be wired by the user into a miniature circuit construction such as a printed circuit or thin film circuit by soldering to the gold-chromium terminals. The device shown in FIG. 6 has particular advantages arising from its having a terminal at each end of the glass plate corresponding to each electrode. These are that there is extra flexibility when wiring the device into the circuit; also , when the connections are made to both ends of the device the transistor may be held more firmly in the circuit by its connections. A further advantage is that it is possible to make a cross-over on the circuit from one end of the glass plate to the other, provided that the circuit allows the crossing lead to be tied to one of the three transistor electrodes.

By a thin film circuit is meant a circuit in which a number of areas of thin metallic film are deposited on a substrate in the form of a thin insulating plate to form the connecting leads for various components which are mounted or formed on the plate. In the art it is known to form capacitors and resistors by deposition on to the substrate. It is also possible to form inductances by deposition methods. Active components, however, are usually made separately and then mounted on the substrate and connected into the circuits. It will be appreciated that a transistor consisting of a semiconductor die mounted on a flat insulating glass plate as shown in FIG. 4 or FIG. 6 is of particular advantage for mounting on the substrate of a thin film circuit. This is that the transistor may be mounted at any place on top of the thin film circuit, that is to say over the connecting pattern and passive circuit elements already deposited on the substrate of the thin film circuit. The transistor is connected into the rest of the circuit by soldered leads from the connecting pattern of the thin film circuit to the exposed metallic film terminals on the glass plate of the transistor. The glass plate of the transistor may be joined to the thin film circuit by an adhesive or, if a transistor as shown in FIG. 6 is used, it may be held in place solely by the connecting leads. In either case it may be finally held in place by an encapsulating material covering the whole thin film circuit. The mounting of the transistor on top of the thin film circuit leads to flexibility in the circuit layout, and a possible reduction in the overall area of the thin film circuit.

Figure 7:
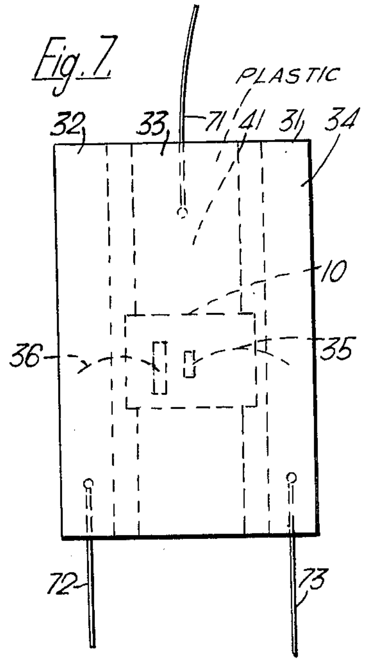
FIG. 7 shows a plan view of the transistor die mounted on the modified glass plate, but with external connecting wires joined to the stripe electrodes and the whole glass plate encapsulated in a hardenable plastics material.

The finished transistors shown in FIGS. 4 and 6 have only part of the glass plate covered with the encapsulating material so as to leave exposed large area terminals to which soldered connections may later be made. FIG. 7 illustrates a possible modification to the method of making a finished transistor. After mounting the die 10 on the metallic film stripe 33 on the glass plate 31, and connecting the thin gold wires 35 and 36 to the stripes 34 and 32, leads 71, 72, and 73 are soldered to the stripes 33, 32, and 34 respectively and then the whole of the glass plate 31 is covered with the encapsulating material 41. The covered plate 31 with the extending leads 71, 72, and 73 is then the finished transistor. In certain cases the finished transistor with leads already attached may be in a more convenient form for the eventual user. The various advantages described above for incorporating the transistor into a printed circuit or thin film circuit still, of course, apply.

The method of mounting and encapsulation has been described above as applied to a semiconductor die in the form of an n-p-n single-crystal planar epitaxial transistor. The transistor need not be epitaxial or even planar, as long as the collector electrode is at a plane surface which forms one face of the semiconductor die while the other electrodes are at the remainder of the surface of the die. Moreover the method is applicable not only to transistors. On the one hand it could be used with simple diodes, and on the other hand with semiconductor dies containing solid-state circuits, i.e. more complicated multiple devices and circuits, such as matched transistors, diode networks and the like (including integral resistors and capacitors in the semiconductor material). Again the principle would apply that one electrode of at least one or more active elements must be at a plane surface which forms one face of the semiconductor die while other electrodes are at the remainder of the surface of the die.

It would also be possible to mount more than one semiconductor die on a single glass plate. This would be particularly useful for making multiple devices such as matched transistors and diode networks. Each transistor or diode would be formed in an individual semiconductor die and be mounted on a separate area of gold-chromium film. Fine gold wires would then be used to make connections from the upper electrodes to separate areas of gold-chromium film, or in some cases direct from an upper electrode on one die to an upper electrode on another die, according to the circuit configuration required. In the case of a diode network, for example, one or more resistors might also be mounted on gold-chromium films on the glass plate. As described previously, encapsulation by means of a hardenable plastics material might leave large area gold-chromium terminals exposed on the glass plate, or alternatively external leads could be soldered to the gold-chromium areas and the whole of the glass plate covered with the encapsulating material. Such multiple devices could then be incorporated into a printed circuit or thin film circuit with the same attendant advantages as for the devices described above with reference to FIGS. 4, 6 and 7.

In the description so far the insulating substrate has been particularised as glass and the deposited thin metallic film as graded gold-chromium. The glass plate is, in fact, a microscope cover glass or slide. However, it is possible to use other thin insulating plates such as ceramic plates, silicon plates, mica or other suitable refractory insulating materials, or where applicable, organic plastics materials in the form of plates. Also, other thin metallic film might be used which has satisfactory properties for conducting leads, is adhesive to the substrate employed, and is soft solderable for making further connections. Furthermore, the thin metallic film could be deposited on an insulating substrate by methods other than vapour deposition. For example plating methods might be used as in the "printed circuit" technique.

What I claim is:

1. A semiconductor arrangement comprising a thin insulating plate on which plate are deposited a number of areas of thin metallic film, and on which plate two or more semiconductor dies are mounted and encapsulated, each semiconductor die containing one active circuit element with one electrode at a plane surface which forms one face of the semiconductor die while at least one other electrode is at another face of the surface of the die, each said semiconductor die having said plane surface joined to a separate area of said thin metallic film with the other electrode being connected by a thin wire to other connection points, and the semiconductor dies and the thin wires being sealed by a deposited mass of hardenable plastics material on the thin insulating plate to cover completely said semiconductor dies, said plate forming one wall of said seal.

2. A semiconductor arrangement as claimed in claim 1 in which one or more passive circuit components are also mounted and encapsulated on the thin insulating plate, each on an area of thin metallic film.

3. A semiconductor arrangement as claimed in claim 2 which comprises a diode network.

4. A semiconductor arrangement as claimed in claim 1 in which each of the semiconductor dies contains a matched transistor.

5. A semiconductor arrangement as claimed in claim 1 in which the deposited mass of hardenable plastics material covers only part of the thin insulating plate, with part of at least some of the areas of thin metallic film left exposed to act as large area terminals for the multiple semiconductor device or circuit.

6. A semiconductor arrangement as claimed in claim 1 in which a lead is soldered to at least some of the areas of thin metallic film, and in which the whole of the thin insulating plate is covered by the deposited mass of hardenable plastics material with said leads projecting beyond the thin insulating plate for external connection to the multiple semiconductor device or circuit.

7. A semiconductor arrangement as claimed in claim 1 in which the thin insulating plate is glass.

8. A semiconductor arrangement as claimed in claim 1 in which the thin metallic film is gold-chromium.

9. A transistor comprising a semiconductor die containing the three electrode regions, with the collector electrode being at a plane surface which forms one face of the die, said die being mounted on a thin insulating plate having three separate deposited areas of thin metallic film, with said plane surface collector electrode joined to part of one of said areas and a thin wire connecting the emitter and base electrodes each to part of one of the other two areas respectively, and with the die and the two thin wires sealed by a deposited mass of hardenable plastics material on the insulating plate to cover completely said die, said plate forming one wall of said seal.

10. A transistor as claimed in claim 9 in which the three areas of thin metallic film are three parallel stripes, and in which the semiconductor die is mounted on the centre stripe and the emitter and base electrodes are connected to the stripes on either side.

11. A transistor as claimed in claim 9 in which the deposited mass of hardenable plastics material covers only part of the thin insulating plate, with part of each of the three thin metallic film areas being exposed to act as a large area terminal for external connection to the transistor.

12. A transistor as claimed in claim 11 in which the three stripes run the length of the thin insulating plate and in which the encapsulating hardenable plastics material covers a transverse central portion of the thin insulating plate so that each electrode has two separate exposed terminals, one at each end of the plate.

13. A transistor as claimed in claim 9 in which a lead is soldered to each of the three thin metallic film areas and in which the whole of the thin insulating plate is covered by the deposited mass of hardenable plastics material with said leads projecting beyond the thin insulating plate for external connection to the transistor.

14. A transistor as claimed in claim 9 in which the thin insulating plate is glass.

15. A transistor as claimed in claim 9 in which the thin metallic film is gold-chromium.

16. A transistor as claimed in claim 9 in which the semiconductor die is that of an n-p-n single-crystal silicon epitaxial planar transistor.

References Cited by the Examiner

UNITED STATES PATENTS 3,072,832 1/1963 Kilby ______________ 317—101

OTHER REFERENCES

Electronic Design, vol. 8, No. 23, pages 66 and 67, November 1960.

IBM Bulletin, vol. 5, February 1959.

IBM Bulletin, vol. 1, No. 5, February 1959.

KATHLEEN H. CLAFFY, *Primary Examiner.*

JOHN F. BURNS, *Examiner.*

J. G. COBB, J. J. BOSCO, *Assistant Examiners.*